US011536617B2

(12) United States Patent
Niemann et al.

(10) Patent No.: US 11,536,617 B2
(45) Date of Patent: Dec. 27, 2022

(54) SENSOR ARRANGEMENT FOR MEASUREMENT OF THE TEMPERATURE OF A PANE, IN PARTICULAR A WINDSCREEN

(71) Applicant: Hella Gmbh & Co. KgaA, Lippstadt (DE)

(72) Inventors: Thomas Niemann, Delmenhorst (DE); Olaf Herrmann, Ganderkesee (DE); Thorsten Eggers, Bremen (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 335 days.

(21) Appl. No.: 16/563,613

(22) Filed: Sep. 6, 2019

(65) Prior Publication Data
US 2020/0088590 A1  Mar. 19, 2020

(30) Foreign Application Priority Data
Sep. 19, 2018  (DE) .................... 10 2018 122 940.2

(51) Int. Cl.
*G01K 13/10*  (2006.01)
*B60S 1/08*  (2006.01)
(Continued)

(52) U.S. Cl.
CPC ............ *G01K 13/10* (2013.01); *B60S 1/0822* (2013.01); *G01K 1/143* (2013.01); *H05K 1/0201* (2013.01);
(Continued)

(58) Field of Classification Search
CPC .......... G01K 13/00; G01K 13/10; B60S 1/08; B60S 1/0822; H05K 1/0201–0212;
(Continued)

(56) References Cited

U.S. PATENT DOCUMENTS 3,999,004 A * 12/1976 Chirino ................ H05K 3/4061
174/257
2004/0144564 A1 * 7/2004 Hoffmann ............ H05K 3/4623
174/266

(Continued)

FOREIGN PATENT DOCUMENTS

CN  107650633 B * 1/2021
DE  4006420 C5 * 2/2004 ............. G01N 21/94
(Continued)

OTHER PUBLICATIONS

DE-10325971-A1 English Translation (Year: 2004).*
DE-4006420-C5 English Translation (Year: 2004).*

*Primary Examiner* — Zachary Pape
*Assistant Examiner* — Amir A Jalali
(74) *Attorney, Agent, or Firm* — Muncy, Geissler, Olds & Lowe, P.C.

(57) ABSTRACT

In a sensor arrangement for measurement of the temperature of a disk, it is provided that the sensor arrangement comprises a circuit carrier with a temperature sensor arranged thereon, wherein the circuit carrier and the temperature sensor are arranged in a housing and an electrical connection and a heat-conducting element are guided out from the housing, the heat-conducting element is configured as a rigid pin, the rigid pin has a thermal connection and a mechanical connection to the circuit carrier, the rigid pin is provided and configured to make a thermal contact with the disk.

11 Claims, 1 Drawing Sheet

(51) Int. Cl.
*G01K 1/143* (2021.01)
*H05K 1/02* (2006.01)
(52) U.S. Cl.
CPC ........... *B60S 1/0866* (2013.01); *H05K 1/0204* (2013.01); *H05K 2201/10151* (2013.01)
(58) Field of Classification Search
CPC ............... H05K 1/029; H05K 2201/06; H05K 2201/10151; H05K 2201/10416
See application file for complete search history.

(56) References Cited

U.S. PATENT DOCUMENTS

2010/0231155 A1* 9/2010 Schmidt ................... G01K 1/16
318/473
2012/0006907 A1* 1/2012 Niemann ........... B60H 1/00792
236/44 C

FOREIGN PATENT DOCUMENTS

| DE | 103 25 971 A1 | 12/2004 | |
|---|---|---|---|
| DE | 10325971 A1 * | 12/2004 | ......... B60H 1/00792 |
| DE | 10 2005 038 466 A1 | 4/2007 | |
| DE | 102005038466 A1 * | 4/2007 | ......... B60H 1/00792 |
| DE | 10 2006 060 548 A1 | 6/2008 | |
| DE | 102006060548 A1 * | 6/2008 | ............ B60S 1/0822 |
| DE | 10 2010 026 563 A1 | 1/2012 | |
| DE | 102010026563 A1 * | 1/2012 | ......... B60H 1/00792 |
| JP | 2000-091884 A | 3/2000 | |
| WO | WO-2004108447 A1 * | 12/2004 | ......... B60H 1/00792 |
| WO | WO-2007019817 A1 * | 2/2007 | ......... B60H 1/00792 |

* cited by examiner

SENSOR ARRANGEMENT FOR MEASUREMENT OF THE TEMPERATURE OF A PANE, IN PARTICULAR A WINDSCREEN

BACKGROUND OF THE INVENTION

(1) Field of the Invention

The invention relates to a sensor arrangement for measurement of the temperature of a pane, wherein the sensor arrangement comprises a circuit carrier with a temperature sensor arranged thereon, wherein the circuit carrier and the temperature sensor are arranged in a housing and an electrical connection and a heat-conducting element are guided out of the housing.

(2) Description of Related Art

Generic sensor arrangements are known from DE 10 2010 026 563 A1 and DE 10 2006 060 548 A1. There a flexible printed circuit board is guided out of the housing and brought in contact with a windscreen. A temperature sensor is arranged directly on the printed circuit board, by means of which the temperature of the windscreen can be determined.

Another sensor arrangement with a flexible heat-conducting element is known from DE 10 2005 038 466 B4.

BRIEF SUMMARY OF THE INVENTION

It is the object of the invention to provide a sensor arrangement of the type mentioned initially which can be manufactured particularly favourably.

This object is solved with a sensor arrangement having the features of patent claim 1. Preferred embodiments of the invention are specified in the subclaims.

In a sensor arrangement for measurement of the temperature of a pane, wherein the sensor arrangement comprises a circuit carrier with a temperature sensor arranged thereon, wherein the circuit carrier and the temperature sensor are arranged in a housing and an electrical connection and a heat-conducting element are guided out of the housing, it is provided as essential to the invention that the heat-conducting element is configured as a rigid pin, that the rigid pin has a thermal connection and a mechanical connection to the circuit carrier and that the rigid pin is provided and configured to make a thermal contact with the pane. This contact can either be made directly or indirectly, i.e. directly or via connecting elements. Overall a particularly simple and good sensor arrangement is made with such a sensor arrangement, by means of which in particular the use of a flexible printed circuit board is avoided and the design is thereby significantly simplified. The pane is preferentially a windscreen of a motor vehicle.

In a particularly preferred embodiment of the invention, the rigid pin is part of the electrical connection of the sensor arrangement. As a result, this rigid pin can have two functions, namely to make an electrical contact and at the same time provide a heat-conducting contact. The sensor arrangement is thereby particularly simplified and can be manufactured at favourable cost.

Particularly preferably one layer of the circuit carrier is configured as a thermal guide plate. The circuit carrier is in particular also a printed circuit board with several layers. Particularly preferably the thermal guide plate when viewed from the temperature sensor is the second layer. The temperature sensor is in this case preferably arranged on the pane side so that the thermal guide plate is also the second layer when viewed from the windscreen. Compared to the other layers of the circuit carrier or the printed circuit board, the thermal guide plate is thickened and/or configured with a few breakthroughs and interruptions so that a particularly good thermal heat transport can be accomplished here. Compared to this, the first or lowest layer of the circuit carrier via which the electrical connection to the sensors arranged on the circuit carrier is made, is more delicate and provided with more interruptions and electrical contact possibilities so that this layer is primarily used for electrical contact.

In another preferred embodiment of the invention, the sensor arrangement additionally has a sensor for measurement of the internal moisture and a sensor for measurement of the internal temperature. From the measurement of these then three values in total, namely the measurement of the internal moisture, the measurement of the internal temperature and the measurement of the pane temperature, the difference between the dew point of the disk and the internal temperature can be calculated and thus the tendency of the windscreen to mist up can be calculated.

In a further preferred embodiment of the invention, the sensor arrangement is integrated in an optoelectronic rain sensor unit for motor vehicles. In this case, optical sensors are additionally provided by means of which a reflection on the windscreen can be performed and evaluated, and it is then evaluated whether the light irradiated onto the windscreen is completely or only partially reflected. The reflection behaviour depends on whether water droplets are present on the windscreen. As a result, a rain sensor can be implemented.

In another further development of the invention, the rigid pin is connected thermally to a surface element which makes a larger thermal contact with the disk than the rigid pin itself. This is an indirect thermal contact of the rigid pin with the windscreen which is also possible within the framework of the invention. Preferably the surface element is part of the electrical connection and in particular part of a plug element.

In another further development of the invention, the temperature sensor is connected to the thermal guide plate by a thermally conductive but electrically insulating material. As a result, a particularly good thermal connection from the temperature sensor to the thermal guide plate is achieved. The thermal contact between the pin and the printed circuit board is preferably made from the metallization of the drill hole.

In another further development, the thermal contact with the pane is made in the region of a black film. This is frequently used in connection with such sensor arrangements and preferably covers optically the sensors and contacts on the windscreen.

Overall due to the configuration according to the invention, a coupling to the pane is achieved through the rigid pin itself or through the surface elements and a rapid and precise temperature recording is thus achieved. Pressing of the rigid pin into the layers of the circuit carrier enables a rapid and precise temperature recording. This only thin plastic layer between the layers of the circuit carrier and the solder points of the temperature sensor causes only a small static/thermal measurement error. Since the thermal contact between the rigid pin and the circuit carrier can be made from the metallization of the drill hole, this is possible particularly simply. No additional component is required.

BRIEF DESCRIPTION OF THE DRAWINGS

The invention is explained in further detail hereinafter with reference to an exemplary embodiment shown in the drawings. In detail in the schematic diagrams.

DETAILED DESCRIPTION OF THE INVENTION

Figure 1:
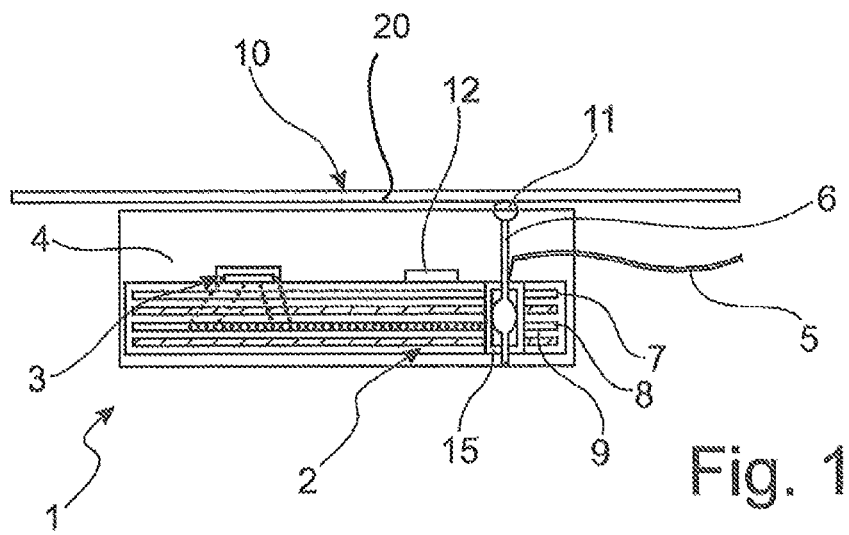
FIG. 1: shows a schematic view of a sensor arrangement according to the invention.

FIG. 1 shows a schematic view of a sensor arrangement 1 according to the invention. A circuit carrier 2, which is typically a printed circuit board, is accommodated in a housing 4. The circuit carrier 2 has a plurality of metal layers 7, 8 and insulation layers located in between. The housing 4 is adjacent to a pane 10, in particular a windscreen. An electrical connection 5 and a heat-conducting element, which is here configured as a rigid pin 6, are guided out from the housing 4. The rigid pin 6 forms a thermal contact 11 with the pane 10. The rigid pin 6 is pressed into the housing 4, which in particular is a plastic housing, and in the printed circuit board 2 preferably a suitably prepared metallized bore 15 is provided into which the rigid pin 6 is pressed so that an electrical and thermal contacting of the rigid pin 6 to the various layers 7, 8 of the circuit carrier 2 is made. The layer 8, which faces away from the pane 10 and which also faces away from a temperature sensor 3 arranged on the circuit carrier 2 or is further removed from this is configured as a thermal guide plate 9. The thermal guide plate 9 is a layer of the circuit carrier 2 which is configured to be thickened and/or has few interruptions, so that a particularly good thermal conductivity is achieved. As a result, the temperature recorded via the pin 6 is transported into the region of the temperature sensor 3 and the temperature sensor 3 can particularly rapidly and precisely detect the temperature of the pane 10. In addition, an electrically insulating but thermally conductive mass can also be introduced here by means of which the temperature sensor 3 is connected to the thermal guide plate 9. Furthermore a sensor for measuring the internal moisture 12 is provided on the housing 4 which is also electrically contacted via the first layer 7 of the circuit carrier 2. The sensor element 3 is also electrically connected to the first layer 7 of the circuit carrier and is controlled via this. This can comprise a two-pole temperature measuring element or a three-pole temperature measuring element wherein a connection is then a separate thermal connection.

Figure 2:
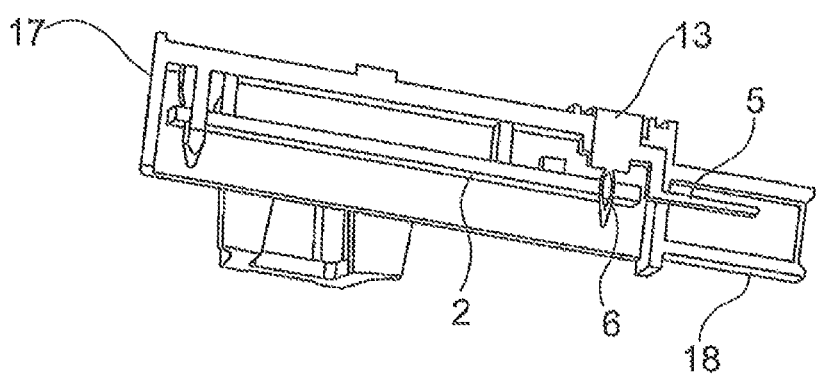
FIG. 2: shows a perspective view of a sensor arrangement according to the invention with a view of the connection of the electrical contact to a plug housing.

FIG. 2 shows a complete arrangement with an outer housing 17 which accommodates the sensor arrangement 1 with the circuit carrier 2. The rigid pin 6 is here connected to a surface element 13 which is in contact with the pane 10 on the outer side of the outer housing 17. As a result a particular good thermal contact is possible. The surface element 13 is part of the electrical connection 5 which extends into a plug housing 18 of the outer housing 17. The electrical connection via the rigid pin 6 to the circuit carrier 2 is made there at the same time via this electrical connection 5.

All the features mentioned in the preceding description and in the claims can be combined in any selection with the features of the independent claim. The disclosure of the invention is thus not restricted to the described or claimed feature combinations, on the contrary all the logical feature combinations within the framework of the invention should be considered to be disclosed.

The invention claimed is:

1. A sensor arrangement for measurement of the temperature of a pane, comprising:
   a circuit carrier with a temperature sensor arranged thereon, wherein the circuit carrier and the temperature sensor are arranged in a housing,
   an electrical connection and a heat-conducting element are guided out of the housing,
   the heat-conducting element is configured as a rigid pin,
   the rigid pin has a thermal connection and a mechanical connection to the circuit carrier,
   the rigid pin is provided and configured to make a thermal contact with the pane, and
   the circuit carrier has at least two electrical conductive layers and one layer of the at least two electrical conductive layers is configured as a thermal guide plate, and wherein the layer configured as the thermal guide plate is thickened and configured with few breakthroughs and interruptions as compared to the at least one other layer of the circuit carrier.

2. The sensor arrangement according to claim 1, wherein the rigid pin is part of the electrical connection of the sensor arrangement.

3. The sensor arrangement according to claim 1, wherein the thermal guide plate when viewed from the sensor is second layer.

4. The sensor arrangement according to claim 1, wherein the sensor arrangement has a sensor for measurement of internal moisture and a sensor for measurement of internal temperature.

5. The sensor arrangement according to claim 1, wherein the sensor arrangement is integrated in an optoelectronic rain sensor unit for motor vehicles.

6. The sensor arrangement according to claim 5, wherein the surface element is part of the electrical connection.

7. The sensor arrangement according to claim 1, wherein the rigid pin is connected thermally to a surface element which makes a larger thermal contact with the pane than the rigid pin itself.

8. The sensor arrangement according to claim 1, wherein the temperature sensor is connected to the thermal guide plate by a thermally conductive but electrically insulating material.

9. The sensor arrangement according to claim 1, wherein the thermal contact between the pin and the circuit carrier is made through metallization of a drilled hole.

10. The sensor arrangement according to claim 1, wherein the thermal contact with the pane is made through a region of black film.

11. A sensor arrangement for measurement of the temperature of a pane, comprising:
    a circuit carrier with a temperature sensor arranged thereon, wherein the circuit carrier and the temperature sensor are arranged in a housing,
    an electrical connection and a heat-conducting element are guided out of the housing,
    the heat-conducting element is configured as a rigid pin,
    the rigid pin has a thermal connection and mechanical connection to the circuit carrier,
    the rigid pin is provided and configured to make a thermal contact with the pane,
    the rigid pin has a direct thermal contact to a surface element which makes a larger direct thermal contact with the pane than the rigid pin itself, and
    the surface element is part of the electrical connection and part of a plug element.

* * * * *